United States Patent
Jeng et al.

[11] Patent Number: 6,124,192
[45] Date of Patent: Sep. 26, 2000

[54] METHOD FOR FABRICATING ULTRA-SMALL INTERCONNECTIONS USING SIMPLIFIED PATTERNS AND SIDEWALL CONTACT PLUGS

[75] Inventors: Erik S. Jeng; Tzu-Shih Yen, both of Hsinchu; Hung-Yi Luo, Taipei, all of Taiwan

[73] Assignee: Vanguard International Semicondutor Corporation, Hsin-Chu, Taiwan

[21] Appl. No.: 09/405,062

[22] Filed: Sep. 27, 1999

[51] Int. Cl.⁷ .................................................. H01L 21/44
[52] U.S. Cl. ........................... 438/597; 438/618; 438/622; 438/624; 438/631; 438/637; 438/666; 438/672; 438/253; 438/241
[58] Field of Search ...................................... 438/597, 622, 438/618, 624, 631, 637, 672, 666, 241, 239, 253

[56] References Cited

U.S. PATENT DOCUMENTS

| | | | |
|---|---|---|---|
| 5,807,779 | 9/1998 | Liaw | 438/279 |
| 5,879,986 | 3/1999 | Sung | 438/253 |
| 5,920,098 | 7/1999 | Liaw | 257/383 |
| 5,956,594 | 9/1999 | Yang et al. | 438/396 |

*Primary Examiner*—John F. Niebling
*Assistant Examiner*—Lynne A. Gurley
*Attorney, Agent, or Firm*—George O. Saile; Stephen B. Ackerman

[57] ABSTRACT

A process for fabricating an interconnect structure, featuring contact of the interconnect structure, to an exposed side of an underlying conductive plug structure, where the conductive plug structure is used to communicate with an active device region in a semiconductor substrate, has been developed. The process features the use of simple photolithographic patterns, such as a stripe opening, exposing a group of gate structures, and a group of spaces, located between the gate structures, to be used for subsequent contact plug formation. This is in contrast to conventional processing, in which a more difficult photolithographic procedure is used to create smaller, individual openings, to individual spaces between gate structures. In addition this invention features a self-aligned opening, exposing only a side of a contact plug structure. An overlying interconnect structure then contacts only the exposed side of the underlying contact plug structure, again reducing photolithographic difficulties, encountered with conventional methods of creating a non-self aligned opening to an underlying contact plug.

21 Claims, 6 Drawing Sheets

METHOD FOR FABRICATING ULTRA-SMALL INTERCONNECTIONS USING SIMPLIFIED PATTERNS AND SIDEWALL CONTACT PLUGS

BACKGROUND OF THE INVENTION

1. Field of the Invention

The present invention relates to methods used to fabricate semiconductor devices, and more specifically to a method used to form an interconnection between an overlying bit line and an underlying contact plug.

2. Description of the Prior Art

The objective of the semiconductor industry, to continually decrease the size of dynamic random access memory, (DRAM), or static random access memory, (SRAM), devices, used for advanced integrated circuits, (IC), is dependent on the ability of specific semiconductor disciplines, to improve processes and tools, that will enable device features of less than 0.25 um, to be realized. Advances in photolithographic exposure tools, have allowed short wavelengths, using KrF, (248 nm), or ArF, (193 nm), to be achieved, however to achieve features of 0.1 um, or less, specific semiconductor elements, such as conductive interconnect structures, and the fabrication processes needed to create these elements at reduced dimensions, are needed, in addition to the advances in photolithographic disciplines.

This invention will describe a novel process resulting in structural innovations that will allow sub-quarter micron features, to be achieved without taxing the photolithographic discipline, by increasing exposure resolution, or by demanding more sensitive photolithographic alignment and critical image control. One features of this invention is the use of merging three contact plug openings, created self-aligned to adjacent gate structures, via use of a single stripe type contact opening, therefore easing patterning difficulties encountered with conventional processes, in which individual openings are formed to individual plug structures. In addition this invention also features the use of a bit line structure, self-aligned to, and contacting the sidewall of, an underlying contact plug structure, in a non-active device region, thus easing the patterning procedure, used with conventional bit line contacts in which an opening to a plug structure is formed in an active device region. Prior art, such as Witek et al, in U.S. Pat. No. 5,393,681, as well as Woo et al, in U.S. Pat. No. 5,451,543, describe methods of forming sidewall contacts, however these prior arts do not describe the merged contact plug approach, or the sidewall contact of a bit line structure to a contact plug, in a non-active device region.

SUMMARY OF THE INVENTION

It is an object of this invention to create ultrasmall interconnect structures, for semiconductor devices, using simplified patterns.

It is another object of this invention to create an merged contact pattern, in a silicon oxide layer, simultaneously exposing a series of regions, located between gate structures, to be used for contact plug structures, thus reducing the complexity of conventional patterning procedures, in which individual openings are made to individual regions, located between gate structures.

It is still another object of this invention, to create a bit line opening, in a silicon oxide layer, self-aligned to adjacent gate structures, and to an adjacent contact plug structure, allowing a subsequent bit line structure, to contact the sidewall of a contact plug structure.

In accordance with the present invention a method is described for forming a self-aligned interconnect structure, contacting the sidewall of an underlying contact plug, using simplified photolithographic patterns. After formation of a series of silicon nitride capped, polycide gate structures, with source/drain regions located between the polycide gate structures, silicon nitride sidewall spacers are formed, leaving a thin layer of silicon nitride remaining on the top surface of the source/drain regions. A simple stripe opening, is created in an overlying first silicon oxide layer, exposing a series of openings, between polycide gate structures, still covered by the thin layer of silicon nitride. After removal of the thin layer of silicon nitride, located between polycide gate structures, individual contact plug structures, are formed on the source/drain regions, located between polycide gate structures, via a deposition of a conductive layer, followed by a chemical mechanical polishing procedure. A bit line opening is created in a second silicon oxide layer, self-aligned to adjacent, silicon nitride encapsulated, polycide gate structures, and exposing the side of a contact plug structure, located between silicon nitride encapsulated, polycide gate structures. Deposition and patterning of a conductive layer, results in the creation of a bit line structure, located overlying the second silicon oxide layer, and located in the bit line opening, contacting the side of the contact plug structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
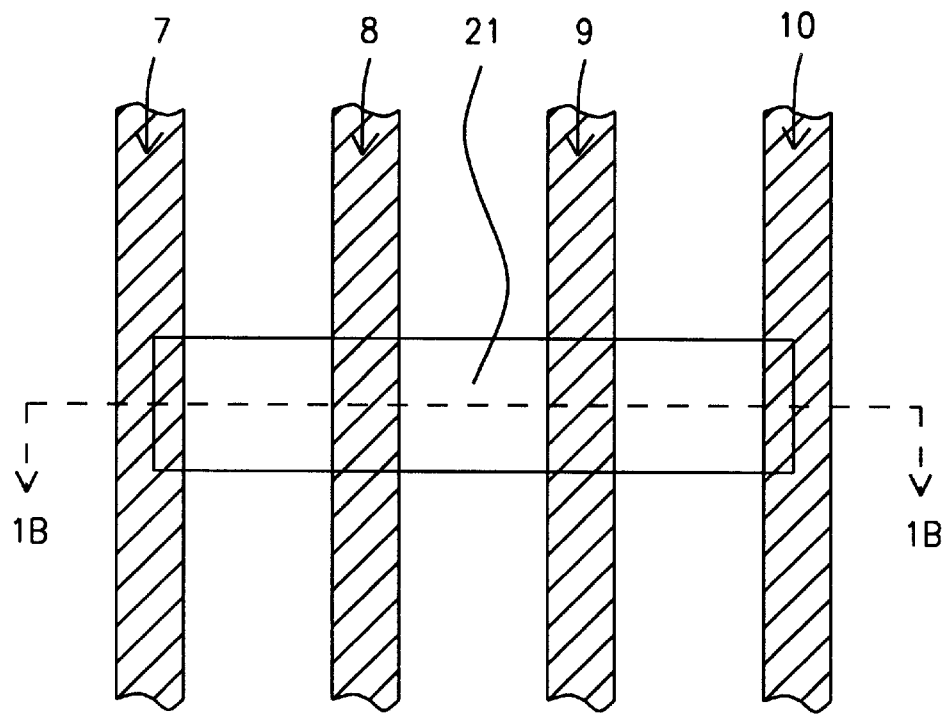
FIGS. 1A, 3A, 5A, 6A, which schematically show the top view, at key stages of fabrication of an interconnect structure, self-aligned to, and contacting the side of, an underlying contact plug structure.

The method of fabricating an interconnect structure, self-aligned to, and contacting the side of, an underlying contact plug structure, will now be described in detail. This invention will be described using NFET devices, however it should be noted that this invention can be also be applied to PFET devices. A P type semiconductor substrate 1, comprised of single crystalline silicon, with a <100> crystallographic orientation, is used and schematically shown, in cross-sectional style, in FIG. 1B. Shallow trench isolation, (STI), regions 2, are used for isolation purposes, defining active device region 21, schematically shown, in the top view of FIG. 1A. STI regions 2, are formed via creating shallow trenches, between about 2000 to 4000 Angstroms, in depth, in semiconductor substrate 1, via conventional photolithographic and anisotropic RIE procedures, using $Cl_2$ as an etchant. After removal of the photoresist shape, used for definition of the shallow trenches, via plasma oxygen ashing and careful wet cleans, a silicon oxide layer, obtained via low pressure chemical vapor deposition, (LPCVD), via plasma enhanced chemical vapor deposition, (PECVD), or via high density plasma chemical vapor deposition, (HDPCVD), procedures, is deposited completely filling the shallow trenches. Unwanted regions of the silicon oxide layer are next removed using either a chemical mechanical polishing, (CMP), procedure, or using a selective, reactive ion etching, (RIE), procedure, using $CHF_3$ as an etchant, resulting in the insulator filled, STI regions 2, schematically shown in FIG. 1B.

A silicon dioxide, gate insulator layer 3, is next thermally grown, in an oxygen-steam ambient, to a thickness between about 30 to 80 Angstroms. A series of depositions are next performed, the first being polysilicon layer 4, obtained via LPCVD procedures, at a thickness between about 500 to 1500 Angstroms. Polysilicon layer 4, can be in situ doped, during deposition, via the addition of arsine, or phosphine, to a silane ambient, or polysilicon layer 4, can be deposited intrinsically, then doped via ion implantation of arsenic or phosphorous ions. A metal silicide layer 5, such as tungsten silicide, is next deposited, using LPCVD procedures, at a thickness between about 500 to 1500 Angstroms, followed by the deposition of silicon nitride layer 6, obtained via LPCVD or PECVD procedures, at a thickness between about 1500 to 3000 Angstroms. Conventional photolithographic and RIE procedures, using $CF_4$ as an etchant for silicon nitride layer 6, and using $Cl_2$ for both metal silicide layer 5, and for polysilicon layer 4, are employed to create silicon nitride capped, polycide, (metal silicide-polysilicon), gate structures 7–10, schematically shown, in cross-sectional style, FIG. 1B, and with a top view, shown schematically in FIG. 1A. The photoresist shape, used for definition of the polycide gate structures, is removed via plasma oxygen ashing and careful wet cleans, which also removes regions of gate insulator layer, not covered by the polycide gate structures.

Figure 1B:
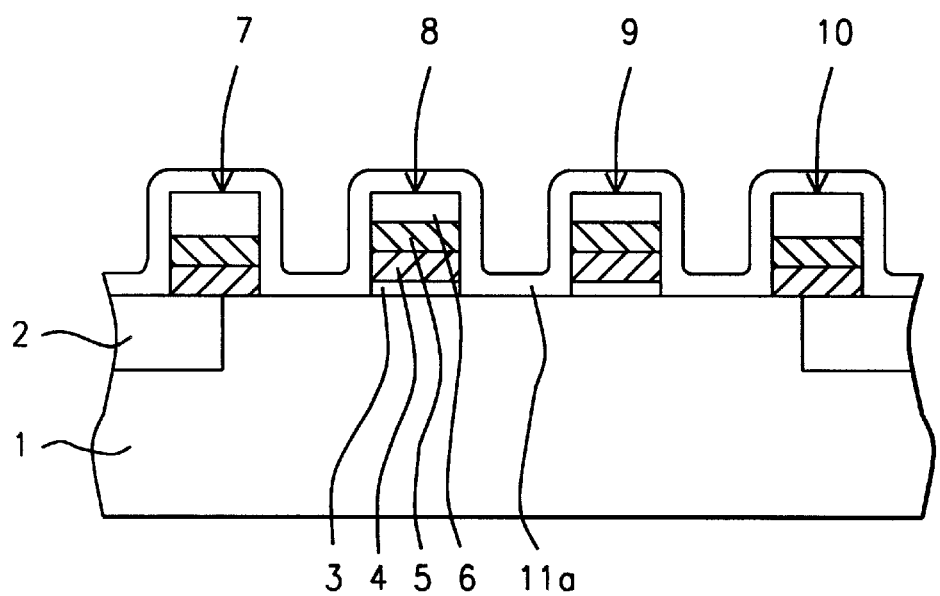
FIGS. 1B, 2, 3B, 4, 5B, 6B, 6C, which schematically, in cross-sectional style, show key stages of fabrication used to create an interconnect structure, self-aligned to, and contacting, the side of a contact plug structure.

Lightly doped, N type, source/drain regions, (not shown in the drawings), are formed in regions of the semiconductor substrate, not covered by the silicon nitride capped, polycide gate structures, via an ion implantation procedure, using arsenic or phosphorous ions, at an energy between about 20 to 40 KeV, and at an implant does resulting in a surface concentration of between about 1E17 to 1E19 atoms/cm$^3$. A silicon nitride layer lla, shown schematically in FIG. 1B, is next deposited via LPCVD or PECVD procedures, to a thickness between about 300 to 600 Angstroms.

Figure 2:
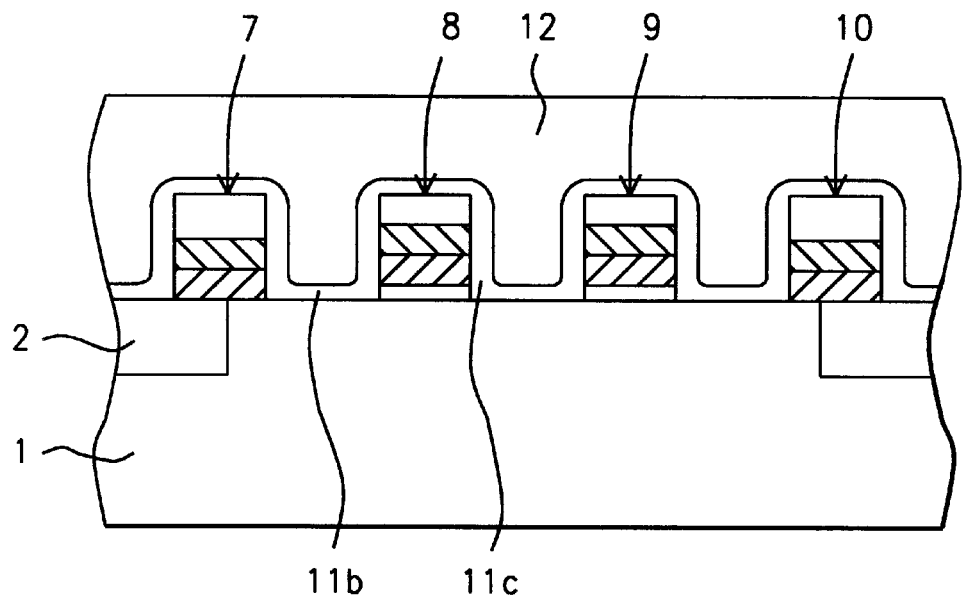

A blanket, anisotropic RIE procedure, using $CF_4/CHF_3$ as an etchant, is next used to thin silicon nitride layer 11a, creating thin silicon nitride layer 11b, now between about 100 to 300 Angstroms in thickness, in regions overlying silicon nitride layer 6, and on the surface of semiconductor substrate 1, in regions between the silicon nitride capped, polycide gate structures, while forming silicon nitride spacers 11c, on the sides of the silicon nitride capped, polycide gate structures. This is schematically shown in FIG. 2. Heavily doped, N type source/drain regions, (not shown in the drawings), are next created in regions of semiconductor substrate 1, not covered by the silicon nitride capped, polycide gate structures, or by silicon nitride spacers 11c, via ion implantation of arsenic or phosphorous ions, at an energy between about 50 to 150 KeV, at an implant dose resulting in a surface concentrattion between about 1E19 to 1E21 atoms/cm$^3$. Silicon oxide layer 12, is next deposited, via LPCVD or PECVD procedures, at a thickness between about 5000 to 10000 Angstroms, using tetraethylorthosilicate, (TEOS), as a source, followed by a CMP procedure, used to create a smooth top surface topography for silicon oxide layer 12. This is schematically shown in FIG. 2.

Figure 3A:
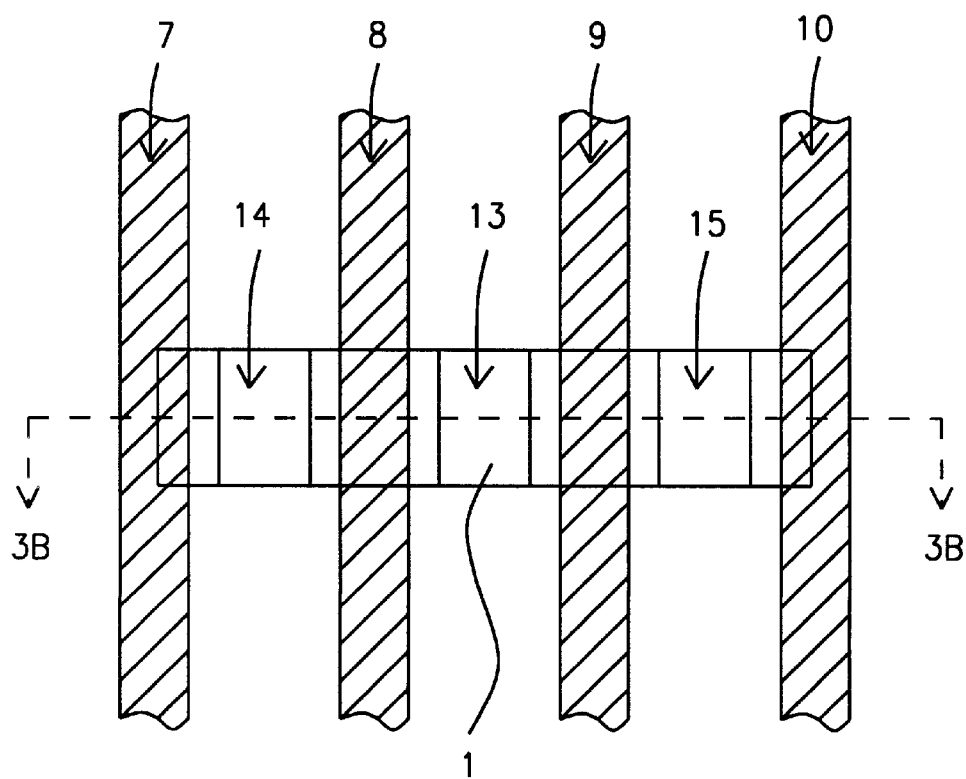
Figure 3B:
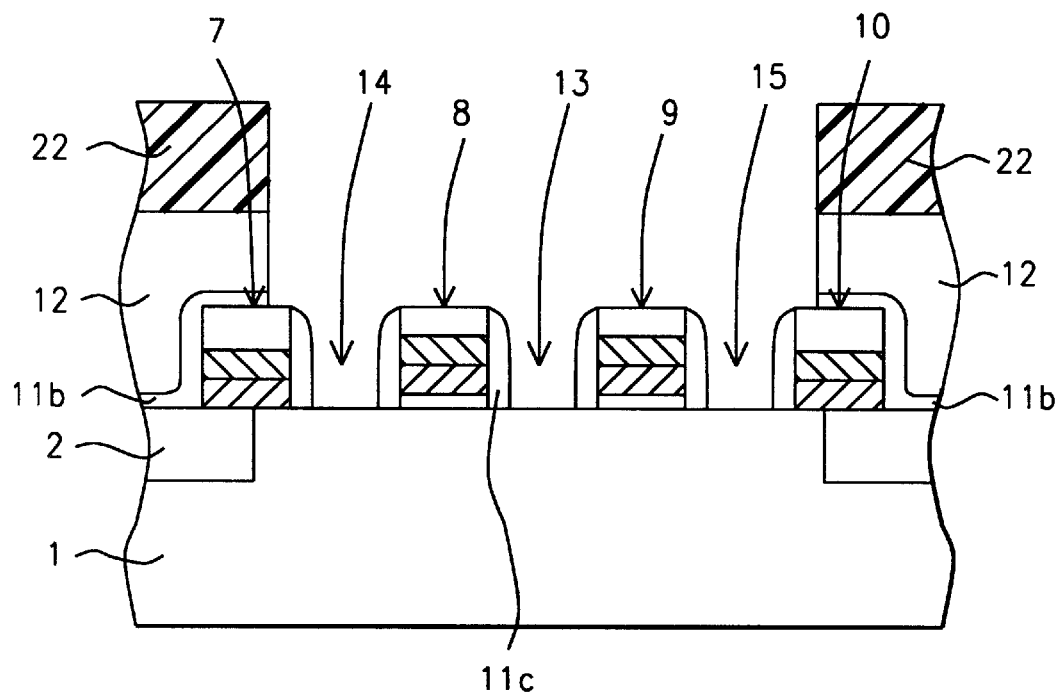

FIGS. 3A, (top view), and 3B, (cross-sectional), schematically show the result of exposing a group of regions, to be used to subsequently accommodate contact plug structures, self-aligned to the silicon nitride capped, polycide gate structures. First a photoresist shape 22, with a stripe opening, identical in dimensions and location to a previous photoresist shape, used for definition of the active device region 21, (FIG. 1A), is used as a mask, to allow a selective RIE procedure, using $C_4F_8$ as an etchant, to remove exposed regions of silicon oxide layer 12. The selectivity, or etch rate ratio of silicon oxide to silicon nitride, is about 10 to 1, allowing this cycle of the RIE procedure, to slow at the appearance of thin silicon nitride layer 11b. Next an in situ removal of thin silicon nitride layer 11b, is performed, using $CH_3F/O_2$ as an etchant, creating self-aligned contact, (SAC), openings 13, 14, and 15, schematically shown in cross-sectional style, in FIG. 3B, and schematically shown for the top view, in FIG. 3A. The etch rate ratio of silicon nitride to silicon oxide, using $CH_3F/O_2$ as an etchant, is between about 5 to 1. The main purpose of the stripe opening, using photoresist shape 22, is to avoid the photolithographic patterning procedures, in terms of alignment, and critical image, that is encountered in conventional openings of individual SAC openings. The trend to narrow polycide widths, can present difficulties even when an narrower photoresist shape is used to form the SAC opening, where the SAC opening has to overlap the polycide gate structure. The use of the stripe opening, merging a group of SAC openings, relieves the difficult photolithographic procedures, encountered with conventional, individual SAC openings.

Figure 4:
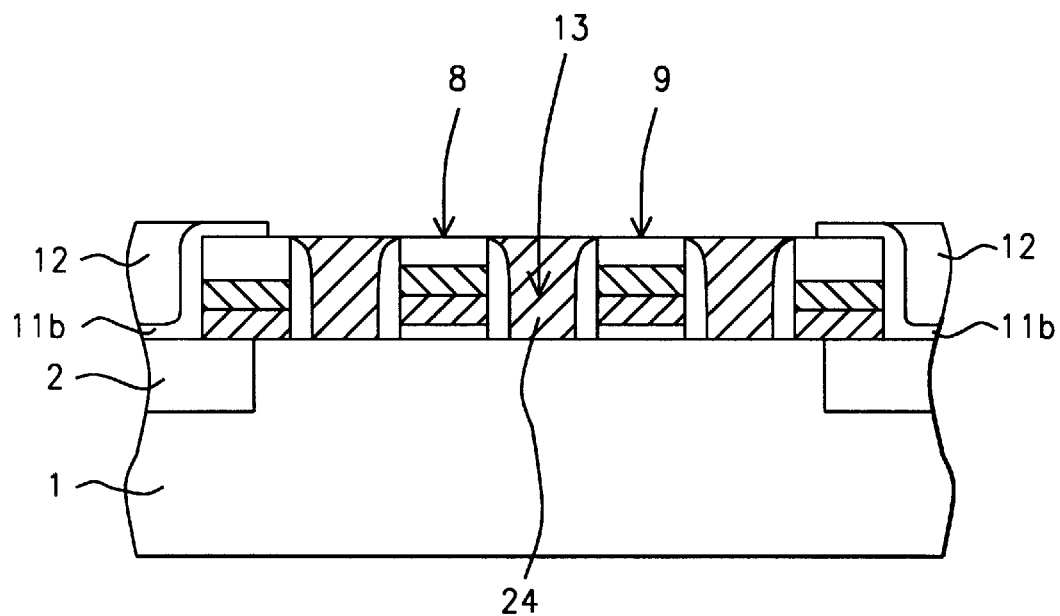

After removal of photoresist shape 22, via plasma oxygen ashing and careful wet cleans, contact plug structures 24, are formed, in SAC openings 13–15, self-aligned to the silicon nitride capped, polycide gate structures. Contact plug structures 24, can be comprised of polysilicon or tungsten. The contact plug structures, are initially formed via LPCVD procedures, at a thickness between about 3000 to 6000 Angstroms, completely filling SAC openings 13–15. If polysilicon is used, doping is accomplished in situ, during deposition, via the addition of arsine, or phosphine, to a silane ambient. A CMP procedure is next employed to remove unwanted regions of polysilicon, (or tungsten), followed by the removal of regions of silicon oxide layer 12, with the CMP procedure stopping at the appearance of silicon nitride, resulting in conductive plug structures 24, in SAC openings 13–15. This is schematically shown in FIG. 4.

Figure 5A:
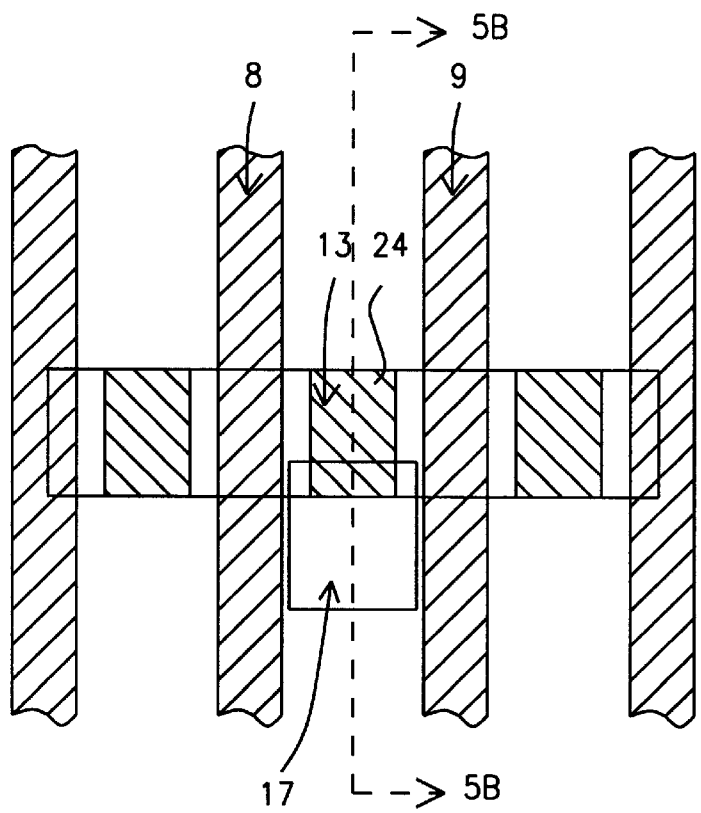
Figure 5B:
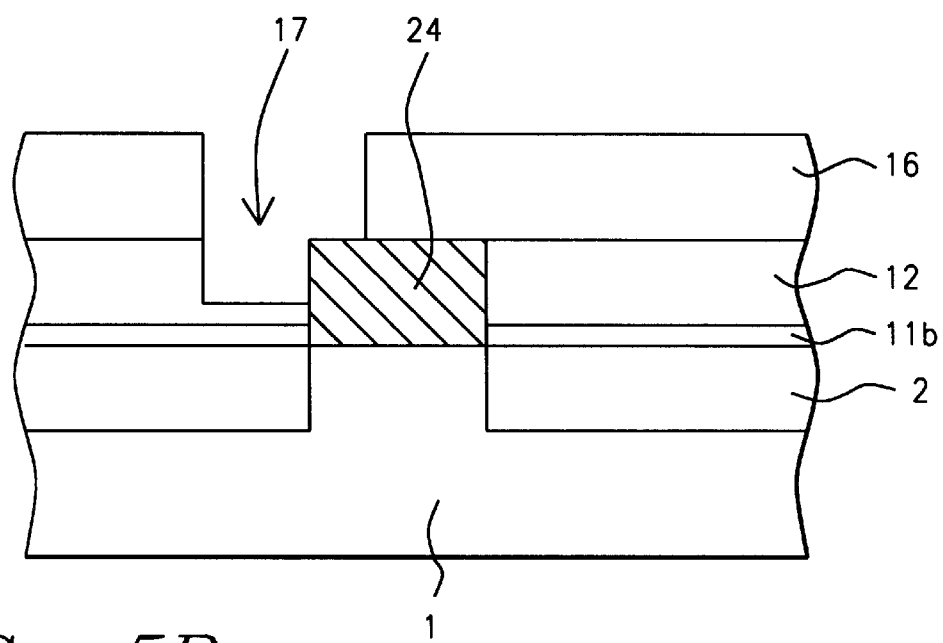

Silicon oxide layer 16, is next deposited, using LPCVD or PECVD procedures, at a thickness between about 1000 to 2000 Angstroms, again using TEOS as a source. A photoresist shape, is then used as an etch mask, to allow bit line contact opening 17, to be created in silicon oxide layer 16, and in silicon oxide layer 12, via a selective RIE procedure, using $C_4F_8/CO$ as an etchant, stopping at the appearance of thin silicon nitride layer 11b, located at the bottom of bit line contact opening 17. The etch rate ratio, between silicon oxide, and either silicon nitride or polysilicon, is between about 10 to 1, using $C_4F_8/CO$ as an etchant. The result of this procedure exposes a side of contact plug structure 24. In order to insure that the side of contact plug structure 24, will be exposed, bit line contact opening 17, is designed to slightly overlap contact plug structure 24, resulting in the exposure of portion of the top surface of contact plug structure 24, in bit line contact opening 17. FIG. 5A, shows bit line contact opening 17, self-aligned to silicon nitride capped, polycide gate structure 8, In addition, to selectively forming opening 17, using $C_4F_8/CO$, and stopping on silicon nitride layer 11b, opening 17, can be formed only to a depth of between about 1500 to 3500 Angstroms, in silicon oxide layer 12, still resulting in exposure of a portion of contact plug structure 24. This is schematically shown in FIG. 5B.

Figure 6A:
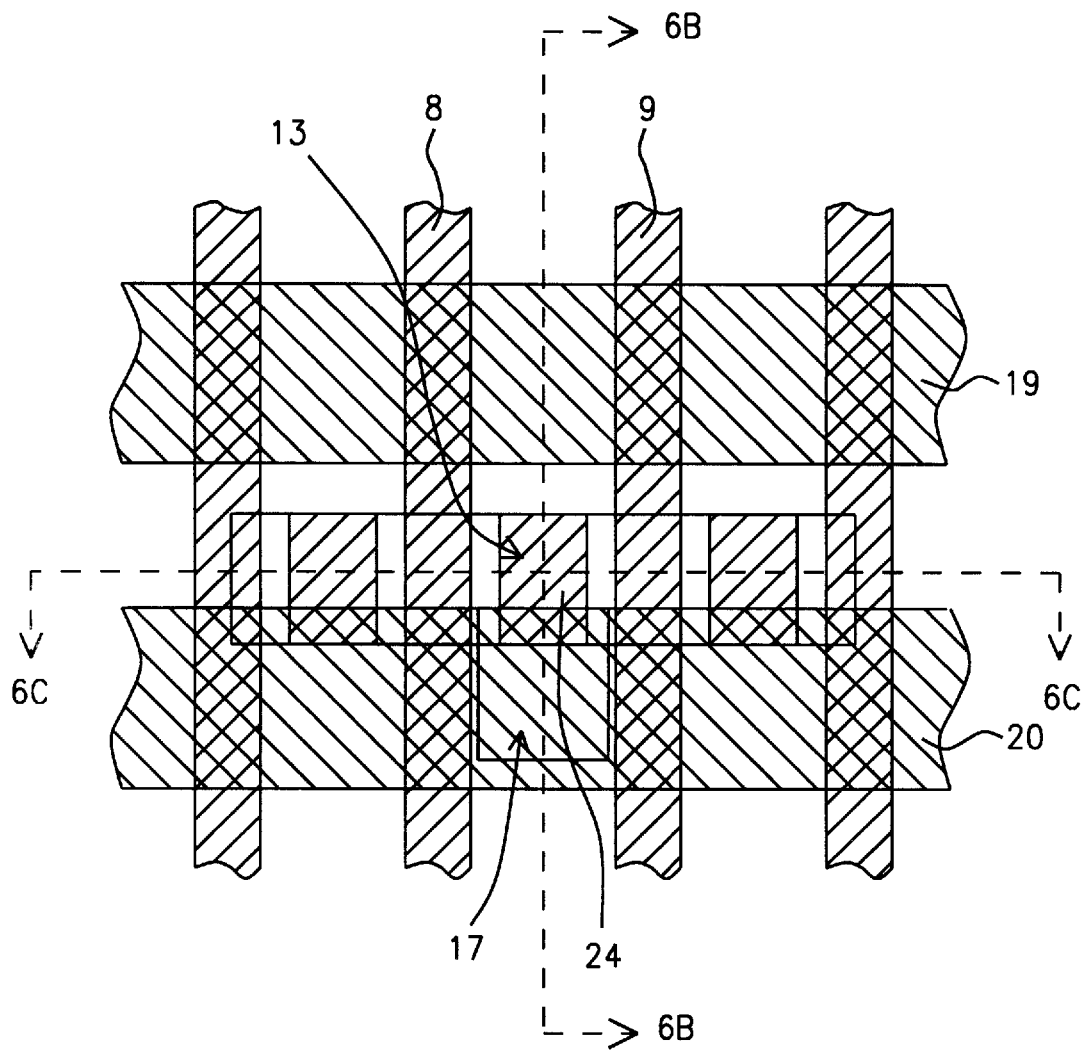
Figure 6B:
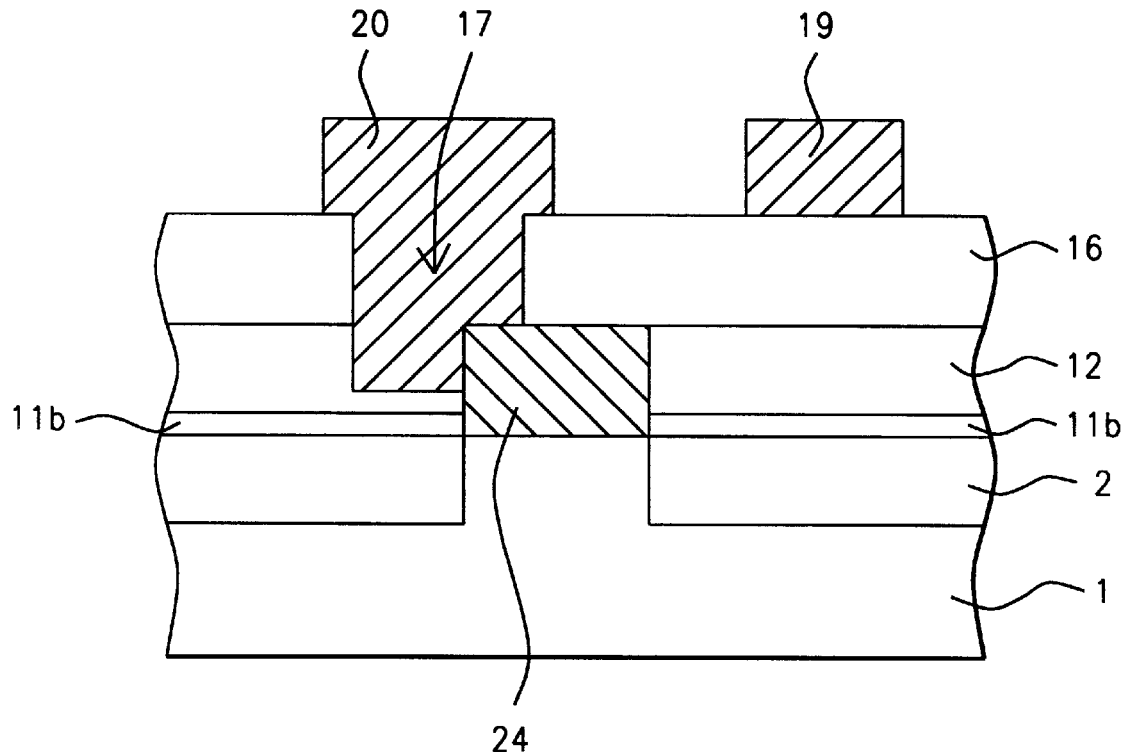
Figure 6C:
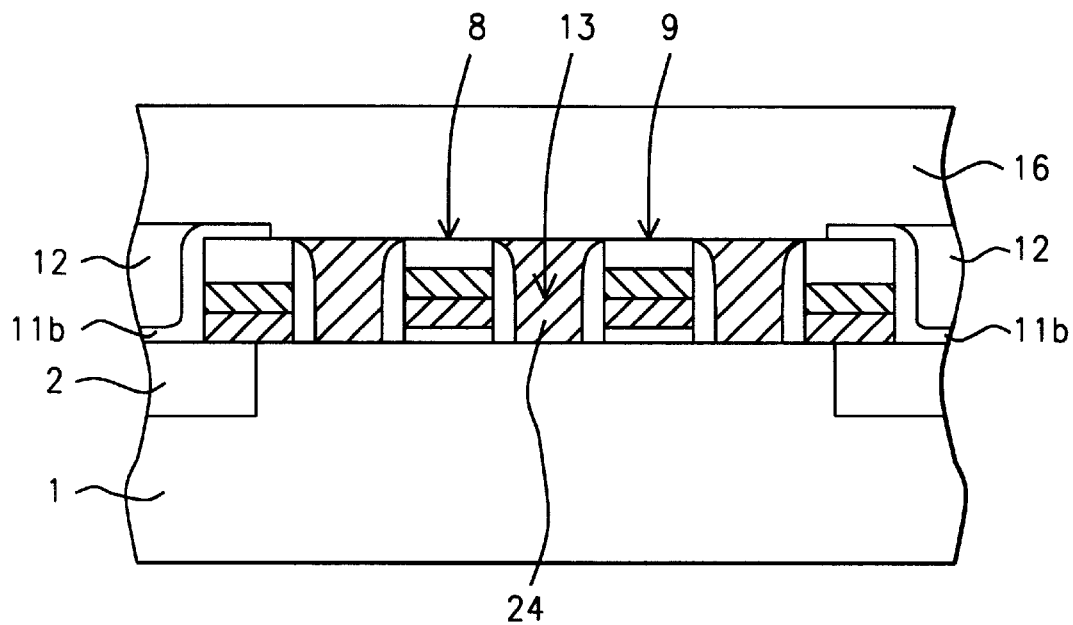

After removal of the photoresist shape, used to define bit line contact opening 17, via plasma oxygen ashing and careful wet cleans, bit line interconnect structures 19, and 20, are formed. Bit line contact interconnect structures can be a polycide structure, comprised of an underlying, N type, in situ doped polysilicon layer, and an overlying tungsten silicide layer, or bit line contact interconnect structure can be comprised tungsten, on an underlying adhesive-barrier layer, of titanium-titanium nitride. The polycide version is obtained via LPCVD procedures, at a thickness between about 1500 to 2500 Angstroms, completely filling bit line contact opening 17, while the tungsten bit line interconnect layer can be obtained using either LPCVD or R.F. sputtering procedures, at a thickness between about 1000 to 2000 Angstroms, again completely filling bit line contact opening 17. Conventional photolithographic and anisotropic, and selective RIE procedures, using $Cl_2$ for polysilicon, or using $SF_6/Cl_2$, for tungsten, as an etchant, are used to create bit line interconnect structures 19, and 20, shown schematically in a top view, in FIG. 6A, and shown in cross-sectional style in FIGS. 6B and 6C. FIG. 6B, schematically shows the desired contact between bit line interconnect structure 20, and contact plug structure 24, occurring mainly at the side of contact plug structure 24. The use of the bit line interconnect structure, contacting the side of the contact plug structure, in an area overlying the non-active device region, allows a reduced active device region to be used. Counterpart designs, employing a bit line contact opening, directly on the top surface of an underlying contact plug structure, would have needed a larger active device region, to accommodate possible misalignment problems. FIG. 6C, schematically, in cross-sectional style, shows the active device region, without the bit line contact opening, and bit line interconnect structure. The photoresist shape, used for definition of the bit line interconnect structures, is once again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating an interconnect structure, on a semiconductor substrate, comprising the steps of:

providing silicon nitride encapsulated gate structures, on a gate insulator layer, with a first portion of said silicon nitride encapsulated gate structures, located on an active device region, of said semiconductor substrate, and with a second portion, of said silicon nitride encapsulated gate structures, located on insulator isolation regions, and with source/drain regions, located in an area of said active device regions, not covered by said first portion of said silicon nitride encapsulated gate structures;

forming a thin silicon nitride layer in regions located between said silicon nitride encapsulated gate structures;

forming a first opening, in a first insulator layer, and in said thin silicon nitride layer, in said active device region, of said semiconductor substrate, exposing a first group of said first portion of said silicon nitride encapsulated gate structures, and exposing said source/drain regions, located between said first portion of said silicon nitride encapsulated gate structures;

forming contact plug structures, on said source/drain regions, exposed between said first group of said silicon nitride encapsulated gate structures, with said contact plug structures self-aligned to said first group of said silicon nitride encapsulated gate structures;

forming a second opening, in a second insulator layer, and in said first insulator layer, exposing a side of a contact plug structure, and exposing a portion of said thin silicon nitride layer, in a region in which said thin silicon oxide layer overlays said insulator isolation region, and with said second opening self-aligned to, and located between, two of said second portions of said silicon nitride encapsulated gate structures; and forming said interconnect structure, on the top surface of said second insulator layer, with said interconnect structure, filling said second opening, and contacting the side of said contact plug structure.

2. The method of claim 1, wherein said silicon nitride encapsulated gate structures, are polycide gate structures, comprised of an overlying tungsten silicide layer, at a thickness between about 500 to 1500 Angstroms, and an underlying polysilicon layer, at a thickness between about 500 to 1500 Angstroms, comprised of a capping silicon nitride layer, obtained via LPCVD or PECVD procedures, at a thickness between about 1500 to 3000 Angstroms, and comprised with silicon nitride sidewall spacers, at a thickness between about 300 to 600 Angstroms.

3. The method of claim 1, wherein said thin silicon nitride layer is formed from a deposition of a silicon nitride layer, via LPCVD or PECVD procedures, at a thickness between about 300 to 600 Angstroms, then thinned, to a thickness between about 100 to 300 Angstroms, via an anisotropic RIE procedure, using $CF_4/CHF_3$ as an etchant.

4. The method of claim 1, wherein said first insulator layer, is a silicon oxide layer, obtained via LPCVD or PECVD procedures at a thickness between about 5000 to 10000 Angstroms.

5. The method of claim 1, wherein said first opening, in said first insulator layer, is performed via an anisotropic RIE procedure, using $C_4F_8$ as an etchant, with an etch rate ratio of silicon oxide to silicon nitride, between about 10 to 1, followed by said first opening, in said thin silicon nitride layer, performed via an anisotropic RIE procedure, using $CH_3F/O_2$ as an etchant, with an etch rate ratio of silicon nitride to silicon oxide, between about 5 to 1.

6. The method of claim 1, wherein said contact plug structures are comprised of polysilicon, obtained via LPCVD procedures, at a thickness between about 3000 to 6000 Angstroms, and doped in situ, during deposition, via the addition of arsine, or phosphine, to a silane ambient.

7. The method of claim 1, wherein said contact plug structures are comprised of tungsten, obtained via LPCVD procedures, at a thickness between about 3000 to 6000 Angstroms.

8. The method of claim 1, wherein said second insulator layer is silicon oxide, obtained via LPCVD or PECVD procedures, to a thickness between about 1000 to 2000 Angstroms.

9. The method of claim 1, wherein said second opening, in said second insulator layer, and in said first insulator layer, is formed via an anisotropic RIE procedure, using $C_4F_8/CO$ as an etchant, with an etch rate ratio, between silicon oxide, to either silicon nitride or polysilicon, between about 10 to 1, using $C_4F_8/CO$ as an etchant.

10. The method of claim 1, wherein said interconnect structure is formed from a polycide layer, comprised of an overlying layer of tungsten silicide, and an underlying layer of in situ doped polysilicon.

11. The method of claim 1, wherein said interconnect structure is formed from a tungsten based layer, comprised of a tungsten layer, overlying a composite layer of titanium-titanium nitride, used as an adhesive-barrier, composite layer.

12. A method of fabricating a bit line interconnect structure, on a semiconductor substrate, with said bit line interconnect structure contacting the side of a bit line contact plug structure, located in a bit line contact hole, comprising the steps of:

forming silicon nitride capped, polycide gate structures, on an active device region, of said semiconductor substrate, and formed on said insulator filled, shallow trench regions;

depositing a silicon nitride layer;

performing an anisotropic RIE procedure to remove a portion of said silicon nitride layer in regions between said silicon nitride capped, polycide gate structures, resulting in a thin layer of silicon nitride, remaining in regions between said silicon nitride capped, polycide gate structures, while leaving said silicon nitride layer, unetched, on the sides of said silicon nitride capped, polycide gate structures;

forming source/drain regions, in an area of said active device region, not covered by said silicon nitride capped, polycide gate structures;

depositing a first silicon oxide layer;

creating a stripe contact hole opening, in said first silicon oxide layer, and in said thin silicon nitride layer, exposing said active device region of said semiconductor substrate, including the exposure of a group of said silicon nitride capped, polycide gate structures, and including the exposure of the source/drain regions, located between said silicon nitride capped, polycide gate structures;

depositing a polysilicon layer;

removing regions of said polysilicon layer, from the top surface of said first silicon oxide layer, and from the top surface of said silicon nitride capped, polycide gate structures, creating contact plug structures, located between, and self-aligned to, said silicon nitride capped, polycide gate structures, exposed in said stripe contact hole opening, and with said contact plugs, overlying said source/drain regions;

depositing a second silicon oxide layer;

opening said bit line contact hole, in said second silicon oxide layer, and in said first silicon oxide layer, exposing a side of a contact plug structure, to be used as said bit line contact plug structure, and exposing a portion of said thin silicon nitride layer, with the portion of said thin silicon nitride layer residing on a portion of an insulator filled, shallow trench region, and with said bit line contact hole, located between, and self-aligned to, two of said silicon nitride capped, polycide gate structures;

depositing a polycide layer, completely filling said bit line contact hole; and patterning of said polycide layer to create said bit line interconnect structure, contacting the side of said bit line contact plug structure, in said bit line contact hole.

13. The method of claim 12, wherein said silicon nitride capped, polycide gate structures, are comprised of a polycide layer, containing an overlying tungsten silicide layer, obtained via LPCVD procedures, at a thickness between about 500 to 1500 Angstroms, and containing an underlying N type, in situ doped, polysilicon layer, obtained via LPCVD procedures, to a thickness between about 500 to 1500 Angstroms, and with the polycide layer capped by a silicon nitride layer, obtained via LPCVD or PECVD procedures, at a thickness between about 1500 to 3000 Angstroms.

14. The method of claim 12, wherein said thin silicon nitride layer, at a thickness between about 100 to 300 Angstroms, is formed via a deposition of a silicon nitride layer, via LPCVD or PECVD procedures, at a thickness between about 300 to 600 Angstroms, then thinned via an anisotropic RIE procedure, using $CF_4/CHF_3$ as an etchant.

15. The method of claim 12, wherein said first silicon oxide layer is obtained via LPCVD or PECVD procedures, to a thickness between about 5000 to 10000 Angstroms.

16. The method of claim 12, wherein said stripe contact hole opening is first formed in said first silicon oxide layer, via an anisotropic RIE procedure, using $C_4F_8$ as an etchant, with an etch rate ratio of silicon oxide to silicon nitride, between about 10 to 1, and then formed in said thin silicon nitride layer, via an anisotropic RIE procedure, using $CH_3F/O_2$ as an etchant, with an etch rate ratio of silicon nitride to silicon oxide, between about 5 to 1.

17. The method of claim 12, wherein said contact plug structures, are comprised of polysilicon, obtained via LPCVD procedures, at a thickness between about 3000 to 6000 Angstroms, and doped in situ, during deposition, via the addition of arsine, or phosphine, to a silane ambient.

18. The method of claim 12, wherein said second silicon oxide layer is obtained via LPCVD or PECVD procedures, at a thickness between about 1000 to 2000 Angstroms.

19. The method of claim 12, wherein said bit line contact hole, is opened in said second silicon oxide layer, and in said first silicon oxide layer, via an anisotropic RIE procedure, using $C_4F_8/CO$ as an etchant, with an etch rate ratio, between silicon oxide, and either silicon nitride or polysilicon, between about 10 to 1.

20. The method of claim 12, wherein said bit line interconnect structure, is formed from a polycide layer, at a thickness between about 1500 to 2500 Angstroms, comprised of an overlying tungsten silicide layer, and an underlying, N type, in situ doped polysilicon layer.

21. The method of claim 12, wherein said bit line interconnect structure, is formed from a tungsten based layer, at a thickness between about 1000 to 2000 Angstroms, comprised of a tungsten layer, overlying a titanium-titanium nitride, adhesive-barrier, composite layer.

* * * * *